US005777944A

United States Patent [19]
Knaack et al.

[11] Patent Number: 5,777,944
[45] Date of Patent: Jul. 7, 1998

[54] CIRCUIT AND METHOD FOR INSTRUCTION CONTROLLABLE SLEWRATE OF BIT LINE DRIVER

[75] Inventors: Roland T. Knaack, Starkville, Miss.; Shiva P. Gowni, Bangalore, India

[73] Assignee: Cypress Semiconductor Corp., San Jose, Calif.

[21] Appl. No.: 720,116

[22] Filed: Sep. 27, 1996

[51] Int. Cl.⁶ .................... G11C 8/00; H03K 19/0948
[52] U.S. Cl. .............. 365/230.06; 365/49; 365/189.05; 365/227; 326/27; 326/57; 326/58; 327/170; 327/380; 327/381
[58] Field of Search .................. 365/230.06, 49, 365/189.05, 227; 326/27, 28, 57, 58; 327/170, 380, 381

[56] References Cited

U.S. PATENT DOCUMENTS

| | | | |
|---|---|---|---|
| 4,853,896 | 8/1989 | Yamaguchi | 365/189.02 |
| 4,855,623 | 8/1989 | Flaherty | 326/87 |
| 5,471,150 | 11/1995 | Jung et al. | 326/87 |
| 5,489,862 | 2/1996 | Risinger et al. | 327/108 |
| 5,517,129 | 5/1996 | Matsui | 326/27 |

Primary Examiner—David C. Nelms
Assistant Examiner—Andrew Q. Tran
Attorney, Agent, or Firm—Blakely, Sokoloff Taylor & Zafman LLP

[57] ABSTRACT

A bit line driver circuit includes a first driver and a second driver. The first driver drives a bit line when the bit line driver is in a first state. The second driver drives the bit line when the bit line driver is in a second state. The first driver is configured to produce a slow slew rate for the bit line and the second driver is configured to produce a faster slew rate for the bit line. The first and second drivers may include a first and second pair of driver transistors which are each coupled to the bit line. The states of the bit line driver circuit may be defined by instruction signals applied to the driver circuit and the driver circuit includes decoder logic to interface the instruction to the first and second pairs of driver transistors.

12 Claims, 2 Drawing Sheets

5,777,944

CIRCUIT AND METHOD FOR INSTRUCTION CONTROLLABLE SLEWRATE OF BIT LINE DRIVER

FIELD OF THE INVENTION

The present invention relates generally to the area of semiconductor memory devices, and more specifically to a circuit and method for controlling the slew rate of bit lines within such devices based upon the type of instruction being executed.

BACKGROUND OF THE INVENTION

Many technological advances in the computer industry have depended upon the ability of semiconductor memory devices to store and retrieve ever increasing amounts of data quickly and inexpensively. Thus, the development of the semiconductor memory has played a major role in the advancement of the computer industry over the past few decades.

Most modern computer systems utilize a Random Access Memory (RAM), which emphasizes the ability to examine each stored piece of data independently of any other piece of data. However, with the drive for computer systems to become increasingly faster, there has become a need for memory devices to execute faster searches.

The Content Addressable Memory (CAM) is a relatively new memory device that accelerates applications requiring fast searches, such as database lists. CAMs provide the ability to compare a desired piece of information against an entire list of pre-stored entries simultaneously. This function enables a decrease in search time by an order of magnitude.

CAMs utilize several types of instructions in order to carry out these rapid comparisons. For example, one instruction may activate a small fraction of the total number of bit lines (e.g., 8 or 16) present in the CAM. Such an instruction may be useful where the CAM has been partitioned and only one section of the total storage area needs to be searched for a particular compare operation. Another instruction may activate all of the bit lines (e.g., 84 or more depending upon the memory array architecture) where all storage areas of the CAM require reading.

Instructions that activate only a small fraction of the total number of bit lines in a CAM typically have a more restrictive speed requirement than instructions that activate all of the bit lines. That is, such instructions typically must be executed faster than those in which all of the CAM's bit lines are activated. To accommodate this speed requirement, a strong bit line driver (i.e., one capable of driving the bit line to its operating voltage relatively quickly) is required. However, if the same strong bit line driver is used to activate all of the bit lines (e.g., where the second type of instruction is executed), the power and ground currents create spikes that are unacceptable. Accordingly, what is required is a circuit and method for instruction controllable bit line drivers.

SUMMARY OF THE INVENTION

In one embodiment, the present invention provides a method of controlling the slew rate of a bit line driver. Upon receipt of a first signal to activate a first set of bit lines a first set of complementary-pair transistor driver units is energized such that a first set of bit lines is activated within a time period permitted by the first instruction. Upon receipt of a second signal to activate a second set of bit lines, a second set of complementary-pair transistor driver units is energized such that a second set of bit lines is activated within a time period permitted by the second instruction.

In another embodiment, the present invention provides a bit line driver having first driver means for driving a bit line when the bit line driver is in a first state, and second driver means for driving the bit line when the bit line driver is in a second state. The first driver means is configured to produce a first slew rate for the bit line and the second driver means is configured to produce a second slew rate for the bit line. The first and second driver means may include a first and second pair of driver transistors which are each coupled to the bit line. The states of the bit line driver circuit may be defined by instruction signals applied to the driver, and decoder logic may be used to interface the instruction signals to the first and second pair of driver transistors.

BRIEF DESCRIPTION OF THE DRAWINGS

The present invention is illustrated by way of example and not limitation in the figures of the accompanying drawings in which:

FIG. 1b illustrates typical voltages and transient currents for the bit line driver circuit of FIG. 1a;

DETAILED DESCRIPTION

Figure 1A:
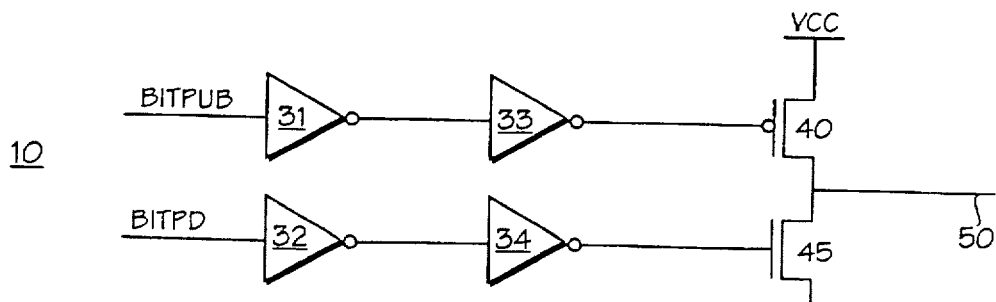
FIG. 1a illustrates a typical bit line driver circuit which may be present in a CAM or other memory device.

Referring to the drawings in detail, wherein like numerals designate like parts and components, the following description sets forth numerous specific details in order to provide a thorough understanding of the present invention. However, after reviewing this specification, it will be apparent to those skilled in the art that the present invention may be practiced without some or all of these specific details. In other instances, well known circuit designs and techniques have not been described in detail in order not to unnecessarily obscure the present invention.

Referring to FIG. 1a, a bit line driver circuit 10 is shown. Bit line driver circuit 10 is typical of bit line drivers utilized in Content Addressable Memories (CAMs) and other semiconductor memory devices. Bit line driver circuit 10 may include inverters 31–34, a PMOS transistor 40, and an NMOS transistor 45. PMOS transistor 40 has a source coupled to a first power source (e.g., VCC) and a drain coupled to bit line 50. NMOS transistor 45 has a source coupled to a second power source (e.g., VSS) and a drain coupled to bit line 50. Of course, bit line driver circuit 10 may be made up of other transistor configurations, for example, transistors 40 and 45 may both be PMOS or NMOS transistors with appropriate driving logic. Therefore, FIG. 1a should be regarded as illustrative of a typical bit line driver circuit only.

During a write instruction, bit line 50 may be activated using signals BITPUB and BITPD. The inverters 31 and 33 may act as driver logic for signal BITPUB. When signal BITPUB is low, PMOS transistor 40 is switched on. Conversely, when signal BITPUB is high, transistor 40 is switched off. Similarly, inverters 32 and 34 may act as driver logic for signal BITPD. When signal BITPD is high, NMOS transistor 45 is switched on and when signal BITPD is low, transistor 45 is switched off. Accordingly, to activate bit line 50 to a logic high state, signals BITPUB and BITPD are both low, causing a logic high output of bit line driver circuit 10 to appear on the interconnected drains of PMOS transistor 40 and NMOS transistor 45. To activate bit line 50 to a logic low state, signals BITPUB and BITPD are both high, causing a logic low output of bit line driver circuit 10 to appear on the interconnected drains of PMOS transistor 40 and NMOS transistor 45. Finally, to tri-state the bit line driver 10, signal BITPUB is high while signal BITPD is low, causing both transistors 40 and 45 to be switched off.

Upon activation of PMOS transistor 40 or NMOS transistor 45, a significant current may be quickly conducted through either transistor. At the same time, the voltage on bit line 50 may increase or decrease to operating levels. The time required for the voltage on bit line 50 to reach operating level is known as the slew rate and may depend upon the characteristics of transistors 40 and 45 as may often be dictated by the speed requirements of the memory device. Unfortunately, rapid slew rates often lead to sharp current spikes as illustrated in FIG. 1b.

Figure 1B:
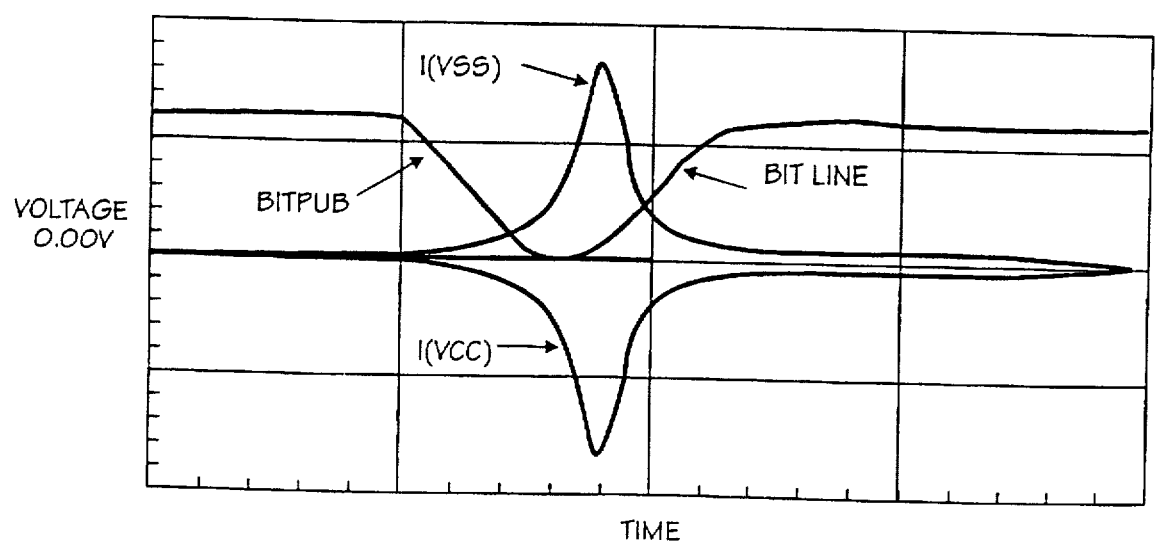

FIG. 1b illustrates typical voltages and currents which may be experienced by bit line driver circuit 10 upon activation of transistors 40 and 45. This may occur, for example, during a write instruction in which all bit lines are activated. It is apparent that as the input driver signal BITPUB transitions from a high to low state, transient currents I(VSS) and I(VCC) are produced. I(VSS) and I(VCC) increase and decrease steeply, resulting in current spikes. It is also shown that this particular bit line driver circuit 10 produces a very rapid slew rate on the bit line voltage.

As discussed above, several types of instructions exist for CAMs such that one type of instruction may activate only a small fraction of the total number of bit lines while other types of instructions may activate all the bit lines within the CAM. Instructions which provide signals that activate only a small fraction of bit lines may have a more stringent speed requirement than instructions which provide signals that activate all of the bit lines. Thus, a strong bit line driver circuit 10 (i.e., one that will provide a rapid slew rate) is needed. A strong bit line driver circuit 10 may be produced by providing fairly large transistors for PMOS transistor 40 and NMOS transistor 45. However, if a large number of strong bit line driver circuits 10 are triggered simultaneously (e.g., when an instruction which provides signals that activate all of the bit lines in the memory device is executed), a resulting cumulative current spike on VSS and VCC may be unacceptable. For example, such current spikes may lead to electromigration problems as well as internal noise on the VSS and VCC power supplies.

Figure 2A:
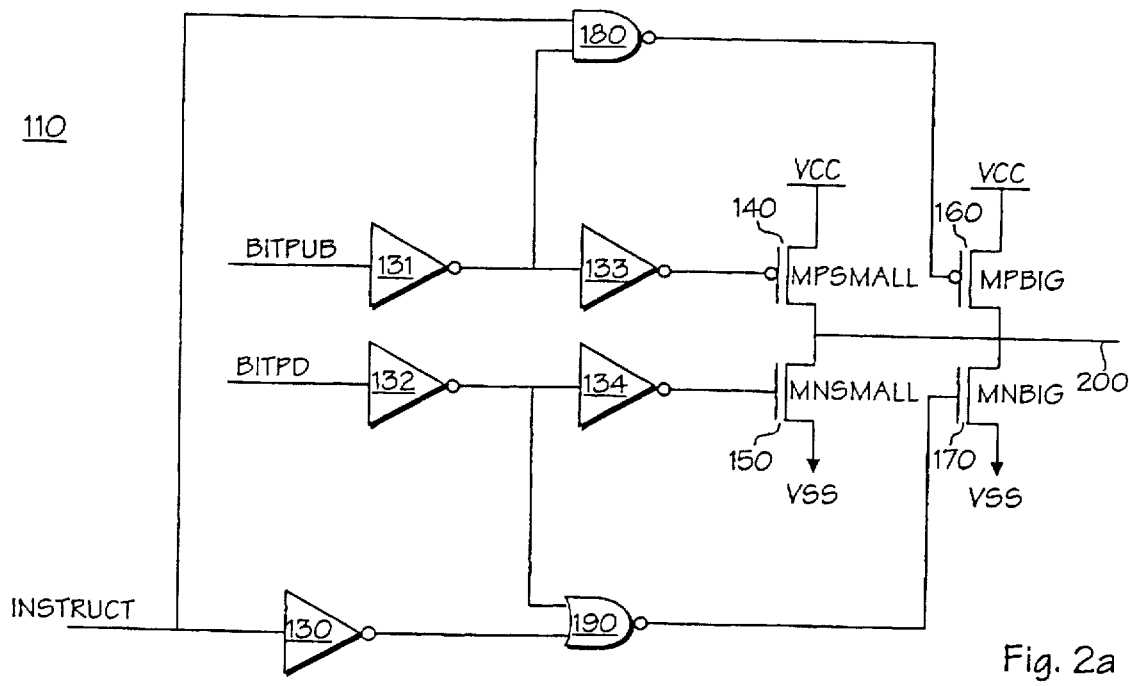
FIG. 2a illustrates a bit line driver circuit according to the present invention.

FIG. 2a. illustrates an exemplary bit line driver circuit 110 which incorporates the apparatus and methods of the present invention and overcomes the problems discussed above. In one embodiment, bit line driver circuit 110 is contained, along with a multitude of other similar bit line drivers, in a Content Addressable Memory (CAM). However, one skilled in the art will appreciate that bit line driver circuit 110 may be embodied in other types of semiconductor memory devices such as Random Access Memories (RAMs).

Bit line driver circuit 110 may include inverters 130–134, a small PMOS transistor (MPSMALL) 140, a large PMOS transistor (MPBIG) 160, a small NMOS transistor (MNSMALL) 150, a large NMOS transistor (MNBIG) 170, a NAND gate 180, and a NOR gate 190. The cumulative size of MPBIG 160+MPSMALL 140 approximately equals the size of PMOS transistor 40 of bit line driver circuit 10. Similarly, the cumulative size of MNBIG 170+MNSMALL 150 approximately equals the size of NMOS transistor 45 of bit line driver circuit 10.

MPSMALL 140 and MPBIG 160 have sources coupled to VCC, while having drains coupled to bit line 200. MNSMALL 150 and MNBIG 170 have sources coupled to a second power source (e.g., VSS) and drains coupled to bit line 200. The gate of MPSMALL 140 is coupled to an output of inverter 133. An input of inverter 133 is coupled to an output of inverter 131. Similarly, the gate of MNSMALL 150 is coupled to an output of inverter 134, which also has an input coupled to an output of inverter 132. The gate of MPBIG 160 is coupled to an output of NAND gate 180. One input of NAND gate 180 is coupled to the output of inverter 131. The gate of MNBIG 170 is coupled to an output of NOR gate 190, which has one input coupled to the output of inverter 130 and a second input coupled to the output of inverter 132.

In one embodiment, the widths of the large transistors (MPBIG and MNBIG) may be configured to be three to five times greater than the widths of the small transistors (MPSMALL and MNSMALL). Inverter 130, NAND gate 180, and NOR gate 190 are typically placed near the periphery of a semiconductor die on which a semiconductor memory incorporating bit line driver circuit 110 is formed. Such a die design ensures that the total layout area of a semiconductor memory including bit line driver circuits 110 would have approximately the same total layout area as those containing bit line driver circuits 10. Nevertheless, one skilled in the art will recognize that other size ratios and design layouts may be used while still maintaining the advantages of the present invention.

Instructions may be received at the bit line driver circuit 110 from opcode decoder logic (not shown) within the memory device and signals BITPUB, BITPD and INSTRUCT may be derived therefrom. As before, to activate bit line 200 to a logic high state, signals BITPUB and BITPD are both low, causing a logic high output of bit line driver circuit 110 to appear on the interconnected drains of the selected driver transistors. To activate bit line 200 to a logic low state, signals BITPUB and BITPD are both high, causing a logic low output of bit line driver circuit 110 to appear on the interconnected drains of the selected transistors. Finally, to tri-state the bit line driver 110, signal BITPUB is high while signal BITPD is low, causing all of the driver transistors to be switched off.

Signal INSTRUCT provides an indication of whether the memory device is executing an instruction which requires all of the bit lines to be activated or only a fraction of the total number of bit lines to be activated. Thus, signal INSTRUCT defines two operating states for bit line driver circuit 110. Signal INSTRUCT may be provided as an input to NAND gate 180 and NOR gate 190 (through inverter 130) so as to control which set or sets of driver transistor circuits will be activated.

Assume that during a write instruction to drive all of the bit lines in the memory device to a logic high state, signal INSTRUCT is low. Accordingly, the output of NAND gate 180 will be high, causing MPBIG 160 to remain off. In addition, the output of NOR gate 190 will be low, causing MNBIG 170 to remain off. Thus, when executing such a write instruction, bit line 200 is driven only by MPSMALL 140 (which is switched on) and MNSMALL 150 (which is switched off for the case of driving bit line 200 to a logic high).

Figure 2B:
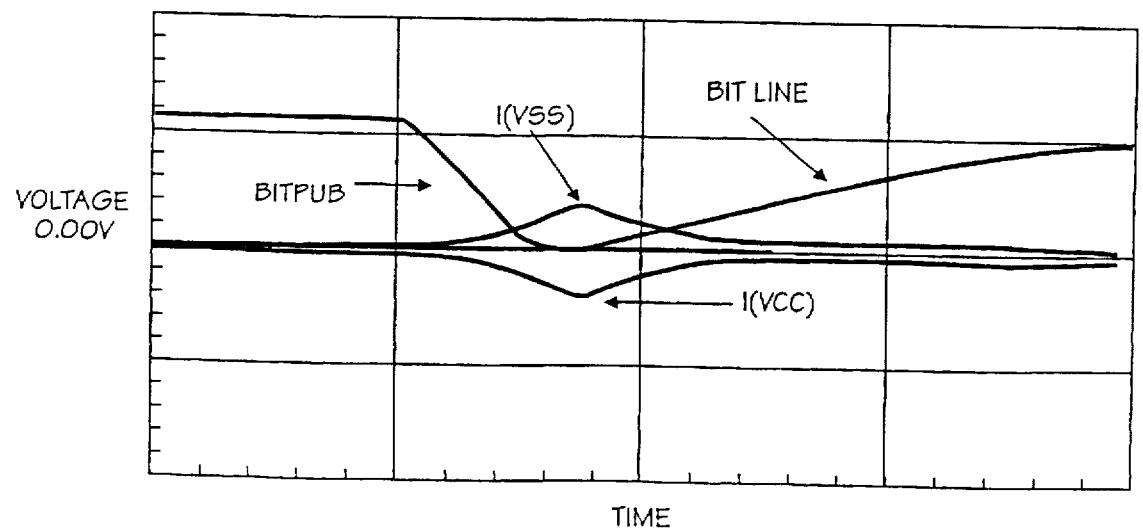
FIG. 2b illustrates typical voltages and transient currents for a bit line driver circuit according to the present invention.

FIG. 2b is shown at the same scale as FIG. 1b and illustrates typical transient voltages and currents for bit line driver circuit 110 during execution of a write instruction which activates all bit lines in the memory device. The current transients, I(VSS) and I(VCC), produced as signal BITPUB transitions from a high to low state are minimal. It is apparent that the slew rate has been reduced as compared to that of the bit line driver circuit 10 shown in FIG. 1a. This is acceptable because, typically, instructions which require all bit lines of the memory device to be activated simultaneously have less stringent speed requirements than those which require only a fraction of the total number of bit lines to be activated. Consequently, a large number of smaller bit line driver circuits may be activated simultaneously, without causing the unacceptable cumulative current spikes discussed above. The reduced current spikes are a result of the smaller transistor sizes used for MPSMALL 140 and MNSMALL 150 as compared to transistors 40 and 45 of bit line driver circuit 10.

Now consider the case where a write instruction to drive only selected bit lines (i.e., a fraction of the total number of bit lines) to a logic high state is presented to the memory device containing bit line driver circuit 110. This time signal INSTRUCT is high. The high signal propagated by INSTRUCT to one input of NAND gate 180 and the high signal received at the second input of NAND gate 180 from inverter 131 (recall that BITPUB is low), cause the output of NAND gate 180 to be low. The low signal transmitted from NAND gate 180 to MPBIG 160 causes MPBIG 160 to switch on.

Similarly, the signal INSTRUCT (as inverted by inverter 130) is presented to one input of NOR gate 190. NOR gate 190 combines this signal with the high signal received at the second input of NOR gate 190 from inverter 132 (signal BITPD is low) to generate an output signal which is a logic low. The low signal transmitted from NOR gate 190 to MNBIG 170 causes MNBIG 170 to switch off. Consequently, MPSMALL 140 and MPBIG 160 are both on, and both transistors drive bit line 200 during such a write instruction.

The resulting slew rate of a write instruction which activates only selected bit lines in the memory device is similar to that of bit line driver circuit 10 shown in FIG. 1b. However, because only a fraction of bit lines in the memory device will be activated, the cumulative current spike would be acceptable.

It will be appreciated that the above descriptions of the waveforms shown in FIGS. 1b and 2b are only examples of the bit line driver circuit driving a logic high on the bit line. Of course, similar operations are realizable when the bit line is driven to a logic low. In such a case, for bit line driver circuit 110, MNBIG 170 and MNSMALL 150 will be switched on and MPBIG 160 and MPSMALL 140 will be switched off (under the control of signals BITPUB, BITPD and INSTRUCT). Similarly, bit line driver circuit 10 may operate to drive bit line 50 to a logic low state. It should also be noted that in some applications, two complementary bit line signals (e.g., BIT LINE and $\overline{\text{BIT LINE}}$) will be driven by a bit line driver circuit 10 or 110 for each bit of data. BIT LINE and $\overline{\text{BIT LINE}}$ are driven with complementary data in such cases.

Thus, a circuit and method for an instruction controllable bit line slew rate has been disclosed. Although the present invention has been described in terms of preferred embodiments, it will be appreciated that various modifications and alterations might be made by persons skilled in the art without departing from the broader spirit and scope of the invention. For example, the bit line driver circuit 110 of the preferred embodiment may be altered to utilize various numbers, sizes and types of transistors. In this way, multiple sets of driver transistors (each with appropriate decoder logic) may be provided to allow for a variety of instruction controllable slew rates. Similarly, the control of the driver transistors need not be supplied from a signal such as INSTRUCT which is derived from an opcode. Instead, the control signal may be provided via an external pin or other hardware connection on an integrated circuit package which contains the bit line driver circuit. Alternatively, the control signal may be provided by an internal state machine or other device. Further, the decoder logic of bit line driver circuit 110 may be altered in various ways to achieve essentially the same results. Therefore, the foregoing discussion should be regarded as illustrative only and the invention measured only in terms of the claims which follow.

What is claimed is:

1. A bit line driver circuit, comprising:

first driver means for driving a bit line at a first slew rate when said bit line driver circuit is in a first state; and second driver means for driving said bit line at a second slew rate when said bit line driver circuit is in a second state.

2. A bit line driver circuit as in claim 1 wherein said first driver means comprises a first pair of driver transistors coupled to said bit line and wherein said second driver means comprises a second pair of driver transistors coupled to said bit line.

3. A bit line driver circuit as in claim 2 wherein said first state is defined by a first set of signals applied to said bit line driver circuit, wherein said second state is defined by a second set of signals applied to said bit line driver circuit, and wherein said first pair of driver transistors drive said bit line in response to said first set of signals and said second set of signals.

4. A bit line driver circuit as in claim 3 wherein said second pair of driver transistors drives said bit line in response to said second set of signals.

5. A bit line driver circuit as in claim 2 wherein said first driver means further comprises a first set of driver decoder logic coupled to said first pair of driver transistors and said second driver means further comprises a second set of driver decoder logic coupled to said second pair of driver transistors and to said first set of driver decoder logic.

6. A bit line driver circuit as in claim 5 wherein said first set of driver decoder logic comprises two pairs of series coupled inverters, each pair of series coupled inverters coupled to a respective one of said first pair of driver transistors.

7. A bit line driver circuit as in claim 6 wherein said first pair of driver transistors comprises a first PMOS transistor having a source coupled to a first power supply terminal, a gate coupled to a first one of said series coupled inverter pairs and a drain coupled to said bit line, and a first NMOS transistor having a source coupled to a second power supply terminal, a gate coupled to a second one of said series coupled inverter pairs and a drain coupled to said bit line.

8. A bit line driver circuit as in claim 7 wherein said second pair of driver transistors comprises a second PMOS transistor having a source coupled to said first power supply terminal, a gate coupled to a first output of said second set of driver decoder logic and a drain coupled to said bit line, and a second NMOS transistor having a source coupled to said second power supply terminal, a gate coupled to a second output of said second set of driver decoder logic and a drain coupled to said bit line.

9. A bit line driver circuit as in claim 8 wherein said second set of driver decoder logic comprises a NAND gate having an input coupled to said first pair of series coupled inverters and an output coupled to said gate of said second PMOS transistor and a NOR gate having an input coupled to said second pair of series coupled inverters and an output coupled to said gate of said second NMOS transistor.

10. A bit line driver circuit as in claim 9 wherein said first pair of driver transistors drives said bit line in response to a first set of signals applied to said first and second sets of driver decoder logic and said second pair of driver transistors drives said bit line in response to a second set of signals applied to said first and second sets of driver decoder logic.

11. A bit line driver circuit as in claim 4 wherein said bit line driver circuit is contained in a semiconductor memory device.

12. A bit line driver circuit as in claim 11 wherein said semiconductor memory device is a Content Addressable Memory (CAM).

* * * * *